United States Patent
Farrens et al.

(10) Patent No.: US 10,693,051 B2
(45) Date of Patent: Jun. 23, 2020

(54) THROUGH BACKPLANE LASER IRRADIATION FOR DIE TRANSFER

(71) Applicant: GLO AB, Lund (SE)

(72) Inventors: Sharon N. Farrens, Boise, ID (US); Anusha Pokhriyal, Sunnyvale, CA (US)

(73) Assignee: GLO AB, Lund (SE)

( * ) Notice: Subject to any disclaimer, the term of this patent is extended or adjusted under 35 U.S.C. 154(b) by 0 days.

(21) Appl. No.: 16/252,044

(22) Filed: Jan. 18, 2019

(65) Prior Publication Data

US 2019/0157533 A1    May 23, 2019

Related U.S. Application Data

(62) Division of application No. 15/463,042, filed on Mar. 20, 2017, now Pat. No. 10,193,038.

(Continued)

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 27/156* (2013.01);
(Continued)

(58) Field of Classification Search
CPC combination set(s) only.
See application file for complete search history.

(56) References Cited

U.S. PATENT DOCUMENTS

| 9,941,262 B2 | 4/2018 | Thompson |
| 10,193,038 B2 | 1/2019 | Farrens et al. |

(Continued)

FOREIGN PATENT DOCUMENTS

| JP | 56-017385 A | 2/1981 |
| JP | H06-340118 A | 12/1994 |

(Continued)

OTHER PUBLICATIONS

International Application No. PCT/IB2017/000334, International Search Report and Written Opinion, dated Aug. 9, 2017, 20pgs.

(Continued)

*Primary Examiner* — Moin M Rahman
(74) *Attorney, Agent, or Firm* — The Marbury Law Group PLLC

(57) ABSTRACT

Light emitting devices can be disposed on the front side of a transparent backplane. A laser beam can be irradiated through the transparent backplane and onto a component located on the front side of the transparent backplane. In one embodiment, the component may be a solder material portion that is reflowed to bond the light emitting devices to the transparent backplane. In another embodiment, the component may be a solder material bonded to a defective bonded light emitting device. In this case, the laser irradiation can reflow the solder material to dissociate the defective bonded light emitting device from the transparent backplane. In yet another embodiment, the component may be a device component that is electrically modified by the laser irradiation.

6 Claims, 13 Drawing Sheets

Related U.S. Application Data

(60) Provisional application No. 62/317,773, filed on Apr. 4, 2016.

(51) Int. Cl.
*H01L 33/00* (2010.01)
*H01L 27/15* (2006.01)
*H01L 33/06* (2010.01)
*H01L 33/30* (2010.01)

(52) U.S. Cl.
CPC .......... *H01L 33/0079* (2013.01); *H01L 33/06* (2013.01); *H01L 33/30* (2013.01); *H01L 2933/0066* (2013.01)

(56) References Cited

U.S. PATENT DOCUMENTS

| | | |
|---|---|---|
| 2002/0171089 A1 | 11/2002 | Okuyama et al. |
| 2009/0035885 A1 | 2/2009 | Karlicek, Jr. et al. |
| 2011/0151602 A1 | 6/2011 | Speier |
| 2011/0200791 A1 | 8/2011 | Kugelmann et al. |
| 2011/0254034 A1* | 10/2011 | Konsek ................ B82Y 20/00 257/98 |
| 2014/0374779 A1 | 12/2014 | Chung et al. |
| 2015/0097201 A1 | 4/2015 | Imai |
| 2015/0318210 A1 | 11/2015 | Budd et al. |
| 2015/0340346 A1 | 11/2015 | Chu et al. |
| 2016/0093665 A1 | 3/2016 | Schubert et al. |
| 2017/0227816 A1 | 8/2017 | Jansen et al. |
| 2017/0236811 A1 | 8/2017 | Pokhriyal et al. |

FOREIGN PATENT DOCUMENTS

| | | |
|---|---|---|
| JP | H07-283438 A | 10/1995 |
| JP | 2002-118124 A | 4/2002 |
| JP | 2002-305356 A | 10/2002 |
| JP | 2003-195783 A | 7/2003 |
| JP | 2008-053408 A | 3/2008 |
| JP | 2010-251359 A | 11/2010 |
| JP | 2001-102689 A | 4/2011 |
| JP | 2011-091264 A | 5/2011 |
| JP | 2012-504875 A | 2/2012 |
| WO | WO2016022824 A1 | 2/2016 |
| WO | WO2016100657 A2 | 6/2016 |
| WO | WO2016100662 A1 | 6/2016 |

OTHER PUBLICATIONS

International Application No. PCT/IB2017/000334, Invitation to Pay Additional Fees, dated Jun. 19, 2017, 16pgs.
International Application No. PCT/IB2017/000334, International Preliminary Report on Patentability and Written Opinion, dated Oct. 18, 2018, 12pgs.
Office Communication from JPO for Japanese Patent Application No. 2017-533007, dated Aug. 23, 2019, 6 pages.
Office Communication pursuant to Article 94(3) from EPO for European Patent Application No. 17721829.4, dated Aug. 16, 2019, 6 pages.

* cited by examiner

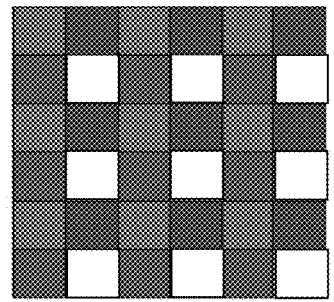
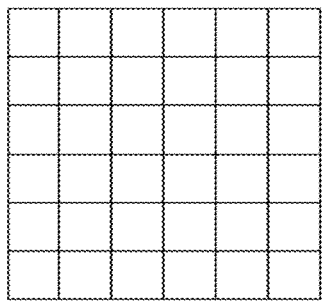
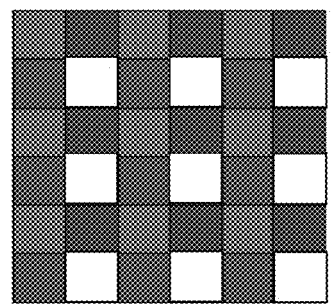
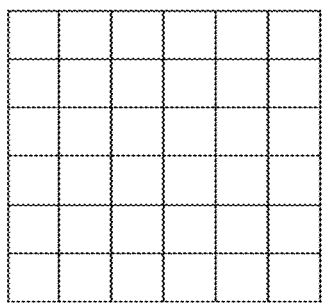
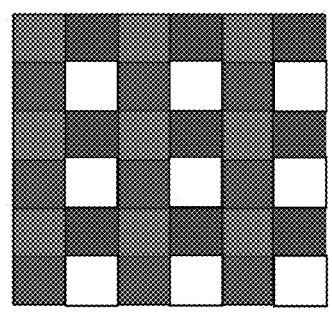
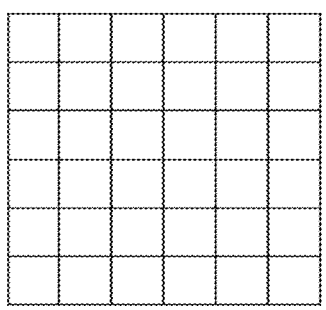
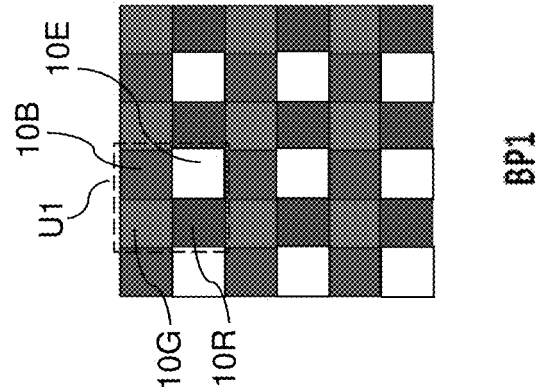
FIG. 2E

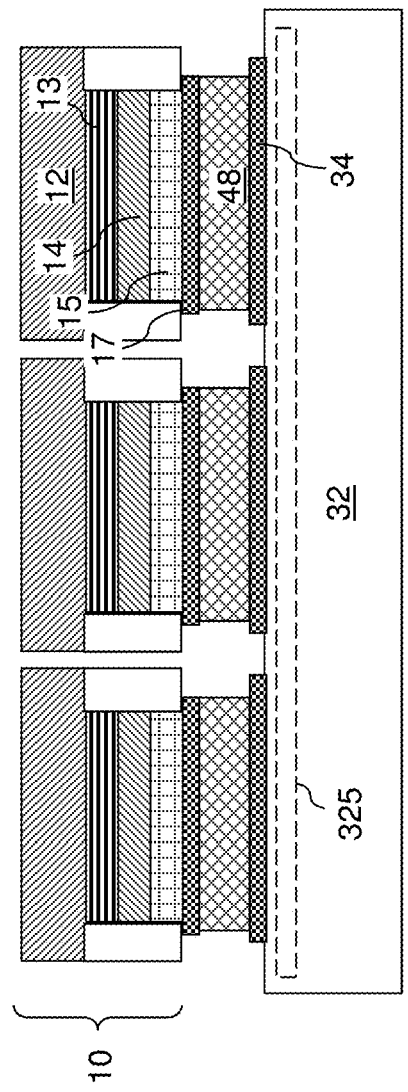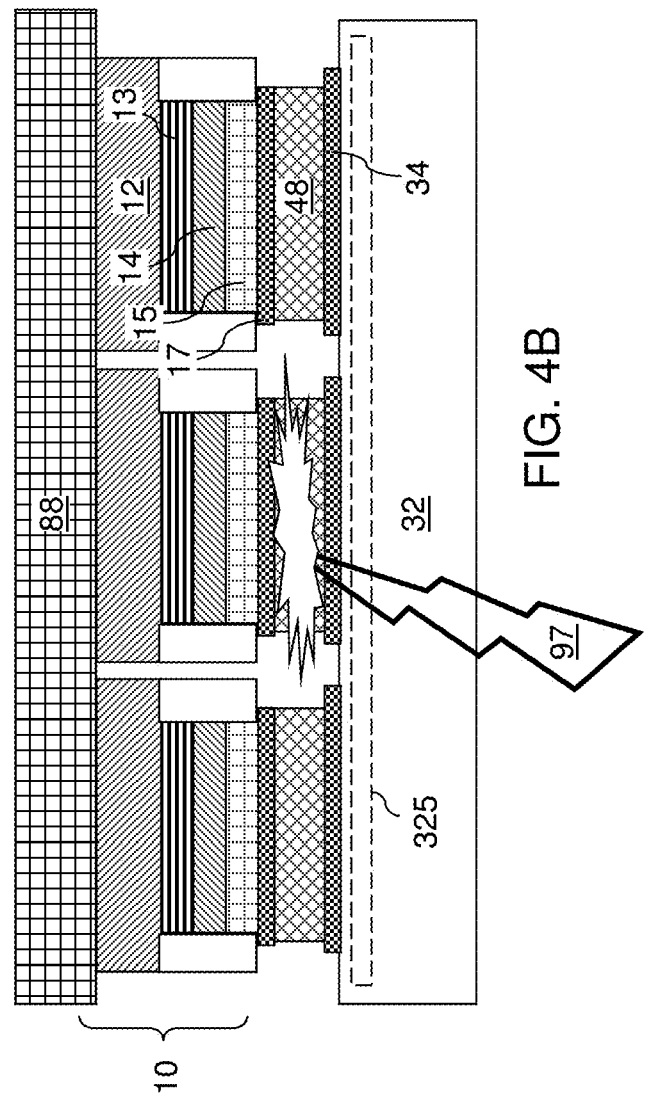

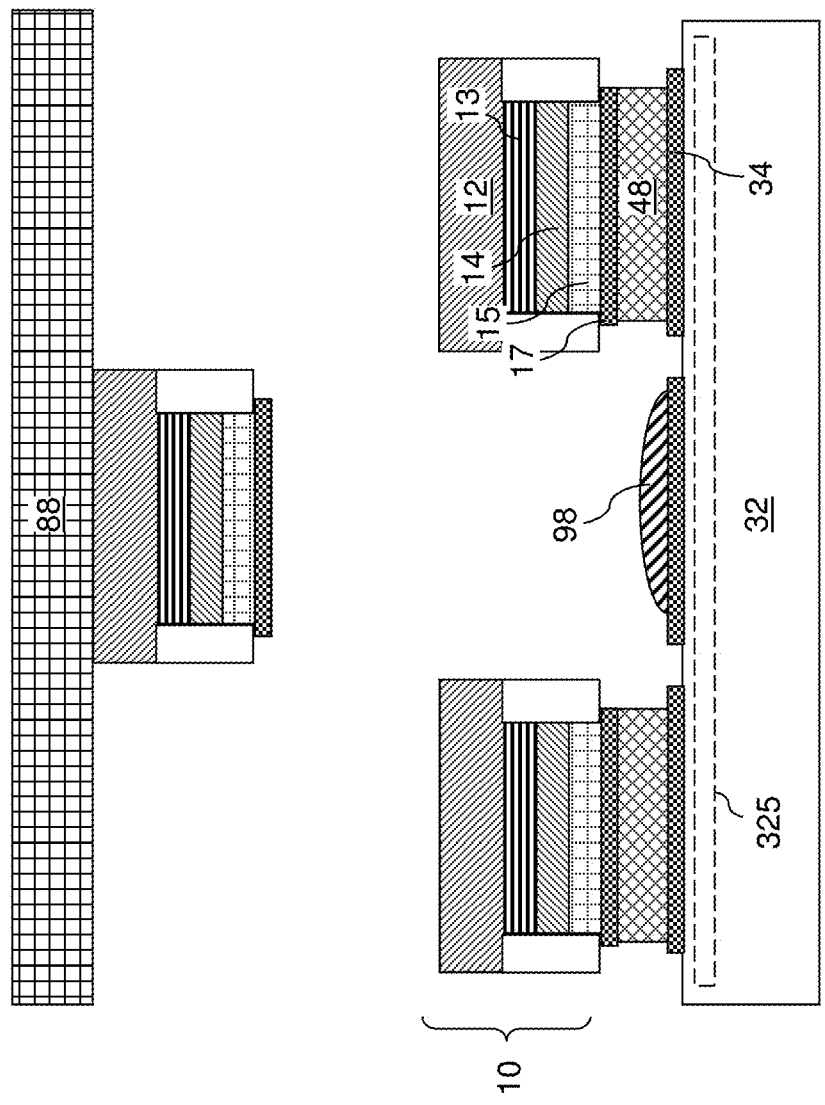

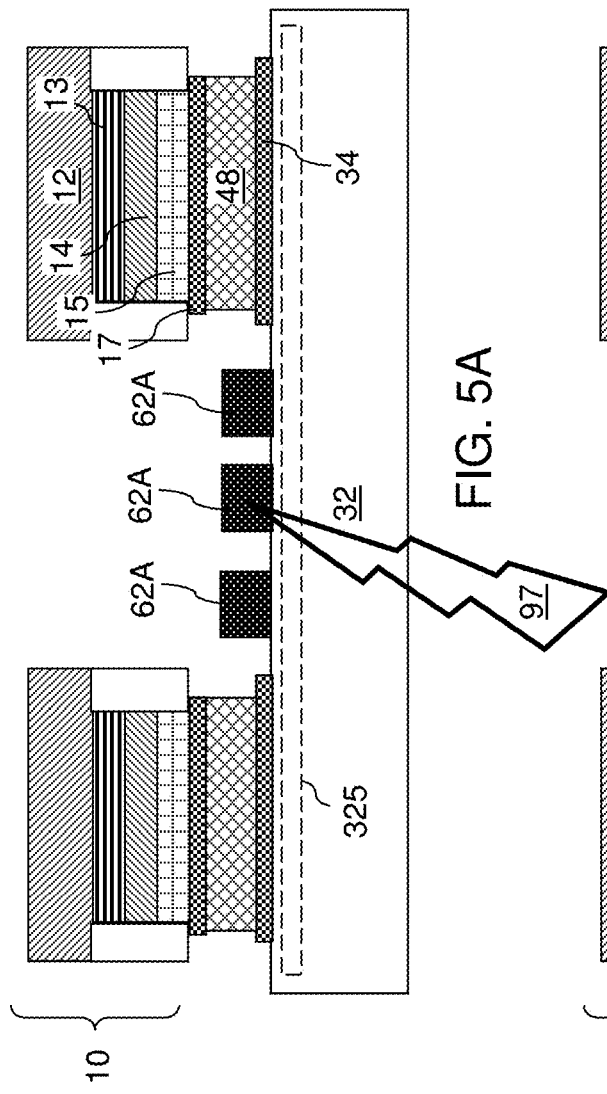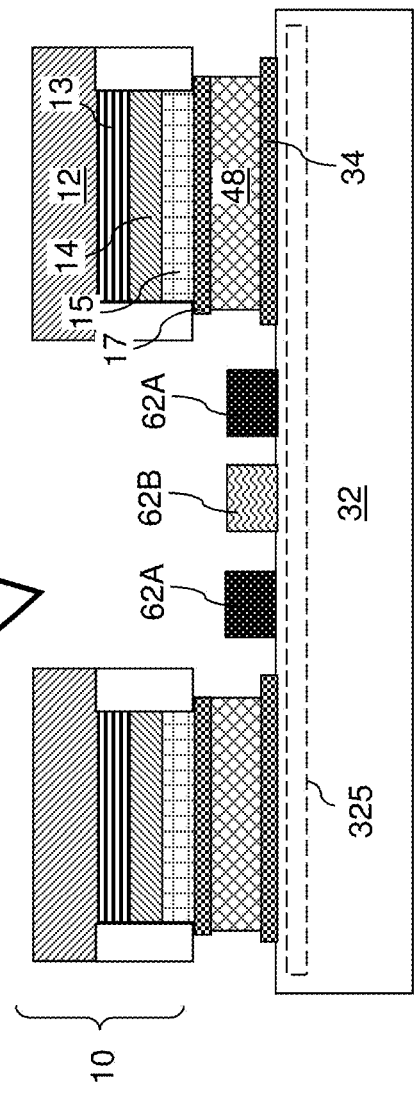
FIG. 5A
FIG. 5B

THROUGH BACKPLANE LASER IRRADIATION FOR DIE TRANSFER

RELATED APPLICATIONS

The instant application is a divisional of U.S. application Ser. No. 15/463,042, filed Mar. 20, 2017, which claims the benefit of priority from U.S. Provisional Application No. 62/317,773 filed on Apr. 4, 2016, the entire contents of which are incorporated herein by reference.

FIELD

The embodiments of the invention are directed generally to a method of manufacturing semiconductor light emitting devices, and specifically to a method of manufacturing a light emitting device assembly including a backplane and light emitting devices, and structures for effecting the same.

BACKGROUND

Light emitting devices such as light emitting devices are used in electronic displays, such as liquid crystal displays in laptops or LED televisions. Light emitting devices include light emitting diodes (LEDs) and various other types of electronic devices configured to emit light.

SUMMARY

According to an aspect of the present disclosure, a method of manufacturing an assembly of a backplane and light emitting devices is provided. The method includes the steps of: providing a substrate with dies of light emitting devices thereupon, wherein a device-side bonding pad is provided on each of the light emitting devices; bonding at least one of the light emitting devices to the backplane; and dissociating each of the at least one bonded light emitting device from the substrate by irradiating a laser beam through the substrate and onto each region of the substrate in contact with the at least one bonded light emitting device.

According to another aspect of the present disclosure, another method of manufacturing an assembly of a backplane and light emitting devices is provided. The method includes the steps of: transferring light emitting devices from a substrate to a backplane by bonding the light emitting devices to bonding sites on the backplane; and dissociating a selected light emitting device among the transferred light emitting devices from the backplane by reflowing a solder material portion attached to the selected light emitting device employing a laser irradiation process, wherein a laser beam passes through the backplane during the laser irradiation process.

According to yet another aspect of the present disclosure, yet another method of manufacturing an assembly of a backplane and light emitting devices is provided. The method includes the steps of: transferring light emitting devices from a substrate to a backplane by bonding the light emitting devices to bonding sites on the backplane, wherein the backplane comprises a device component; and altering an electrical characteristic of the device component on the backplane by irradiating a laser beam passes through the backplane and onto the device component, wherein the laser beam induces a physical change in the device component.

BRIEF DESCRIPTION OF THE DRAWINGS

FIGS. 2A-2E are a schematic sequence for transfer of light emitting devices according to the exemplary transfer pattern illustrated in FIG. 1.

FIGS. 4A-4C are sequential vertical cross-sectional views illustrating a process for removing a light emitting device from an exemplary light emitting device assembly according to an embodiment of the present disclosure.

FIGS. 5A and 5B are sequential vertical cross-sectional views for modifying device components on an exemplary light emitting device assembly according to an embodiment of the present disclosure.

DETAILED DESCRIPTION

Figure 1:
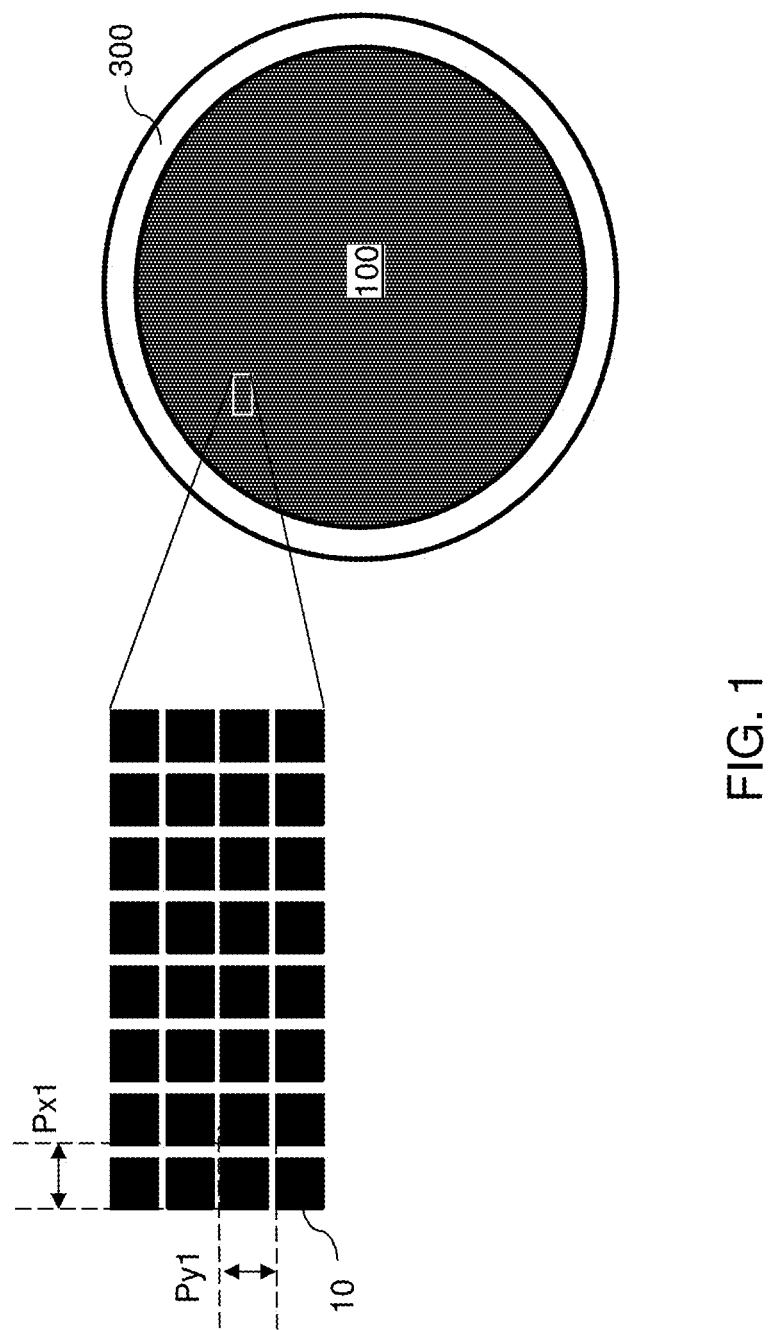
FIG. 1 schematically illustrates a substrate including dies of light emitting devices according to an embodiment of the present disclosure.

As stated above, the present disclosure is directed to an assembly of integrated back light units, and a method of manufacturing the same, the various aspects of which are described below. Throughout the drawings, like elements are described by the same reference numeral. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "light emitting device" refers to any device that is configured to emit light and includes, but is not limited to, a light emitting device (LED), a laser, such as a vertical-cavity surface-emitting laser (VCSEL), and any other electronic device that is configured to emit light upon application of a suitable electrical bias. A light emitting device may be a vertical structure (e.g., a vertical LED) in which the p-side and n-side contacts are located on opposite sides of the structure or a lateral structure in which the p-side and n-side contacts are located on the same side of the structure. As used herein, a "light emitting device assembly" refers to an assembly in which at least one light emitting device is structurally fixed with respect to a carrier structure, which can include, for example, a substrate, a matrix, or any other structure configured to provide stable mechanical support to the at least one light emitting device.

In the present disclosure, a method is provided for transferring an array of devices (such as an array of light emitting devices or an array of sensor devices) from a growth substrate to a target substrate. The target substrate can be any substrate on which formation of multiple types of devices in any configuration is desired. In an illustrative example, the target substrate can be a backplane substrate such as an active or passive matrix backplane substrate for driving light emitting devices. As used herein, a "backplane" or a "backplane substrate" refers to any substrate configured to affix multiple devices thereupon. In one embodiment, the center-to-center spacing of neighboring light emitting devices on the backplane substrate can be is an integer multiple of the center-to-center spacing of neighboring light emitting devices on the growth substrate. The light emitting devices may include a plurality of light emitting devices, such as a group of two light emitting devices, one configured to emit blue light and one configured to emit green light. The light emitting devices may include a group of three light emitting devices, one configured to emit blue light, one configured to emit green light, and one configured to emit red light. As used herein, "neighboring light emitting devices" refer to a plurality of two or more light emitting devices located in closer proximity than at least another light emitting device. The method of the present disclosure can provide selective transfer of a subset of light emitting devices from a light emitting device array on a growth substrate to the backplane substrate.

Devices of a same type can be fabricated on respective initial growth substrates. As used herein, an "initial growth substrate" refers to a substrate that is processed to form devices thereupon or therein. The devices can include light emitting devices and/or sensor devices (e.g., photodetectors) and/or any other electronic devices. The light emitting devices can be any type of light emitting devices, i.e., vertical light emitting diodes, lateral light emitting diodes, or any combination thereof. Devices of the same type can be formed on each initial growth substrate, the types being different from one initial growth substrate to another. The devices can be formed as an array on the respective initial growth substrates.

Utilization of a high percentage of light emitting devices as manufactured on an initial growth substrate for incorporation into backplanes is an essential component of economically manufacturing a direct view light emitting device assembly. Generally, a light emitting device assembly provides a rectangular viewing area, while initial growth substrates typically have circular device areas. After transfer of light emitting devices from a rectangular region of an initial growth substrate to a backplane, a circular substrate can have unutilized region from which devices are not transferred. Methods of the present disclosure provide methods for utilizing the complement of a rectangular center area of an initial growth substrate, or in case devices are transferred to a transfer substrate, for utilizing the complement of a rectangular center area of a transfer substrate.

The methods of the present disclosure employ one of more of the following methods. In some embodiments, dies (i.e., instances of a light emitting device) can be transferred to a temporary support system and placed on a backplane one by one. In some embodiments, defect maps can be supplied to a temporary repair template substrate, and can be attached to a backplane in parallel. In some embodiment, local area replacement or patterned pixel transfer can be employed.

Referring to FIG. 1, a substrate including dies of light emitting devices 10 is illustrated. The substrate may include an edge exclusion region 300 at a periphery, in which devices are not formed. The substrate can include light emitting devices of a same type (which is herein referred to as first type) arranged in a first array configuration. The light emitting devices of the first type are multiple instances of the same device, which may be, for example, light emitting devices that emit light at a same peak wavelength. For example, the light emitting devices of the first type may be red light emitting devices, green light emitting devices, or blue light emitting devices.

The first array configuration has a primary-direction pitch Px1 along a respective primary direction (i.e., the primary direction of the first array configuration) and has a secondary-direction pitch Py1 along a respective secondary direction (i.e., the secondary direction of the first array configuration). As used herein, a primary direction and a second direction of an array configuration refer to two directions along which a unit cell of the array configuration is repeated. In a rectangular array configuration, the primary direction and the second direction may be perpendicular to each other, and are referred to as an x-direction and a y-direction.

The light emitting devices 10 on the substrate can be transferred to multiple backplanes having bonding sites in the second array configuration. A predetermined transfer pattern and a predetermined transfer sequence can be employed for transfer of the light emitting devices 10. Light emitting devices of different types provided from additional substrates can be employed in conjunction with the light emitting devices 10 from the substrate to provide a functional direct view light emitting device assembly.

Referring to FIGS. 2A-2E, an exemplary transfer pattern and an exemplary transfer sequence are illustrated for transferring three different types of devices (10B, 10G, 10R) (e.g., blue, green and red emitting LEDs, respectively) to three backplanes (BP1, BP2, BP3, BP4). The three different types of devices (10B, 10G, 10R) can be provided on three source substrates (B, G, R), which can comprise three transfer substrates, or three growth substrates, or combinations thereof. The first light emitting devices 10B can be provided on the first source substrate B, the second light emitting devices 10G can be provided on the second source substrate G, and the third light emitting devices 10R can be provided on the third source substrate R.

Figure 2A:
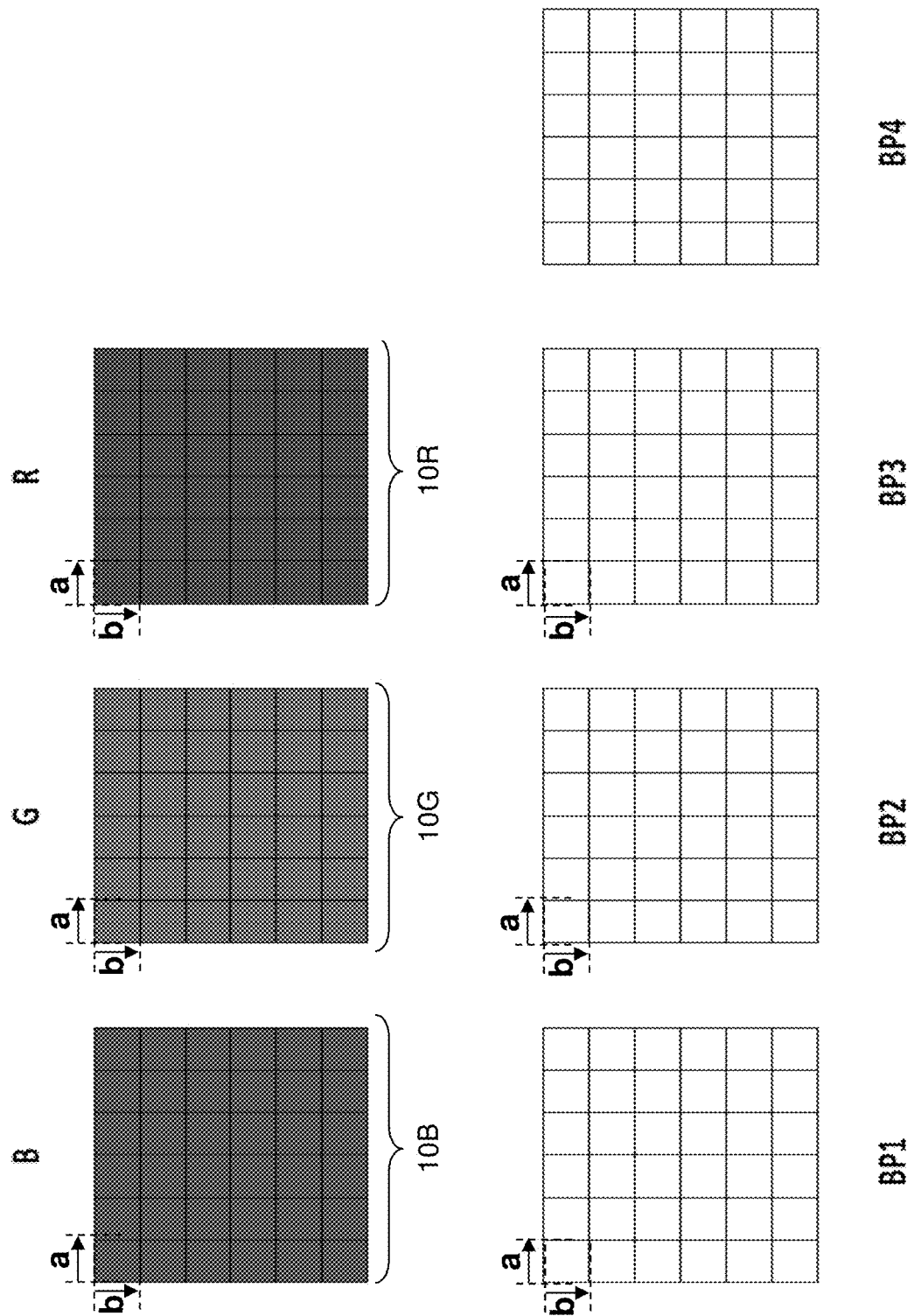
Figure 2B:
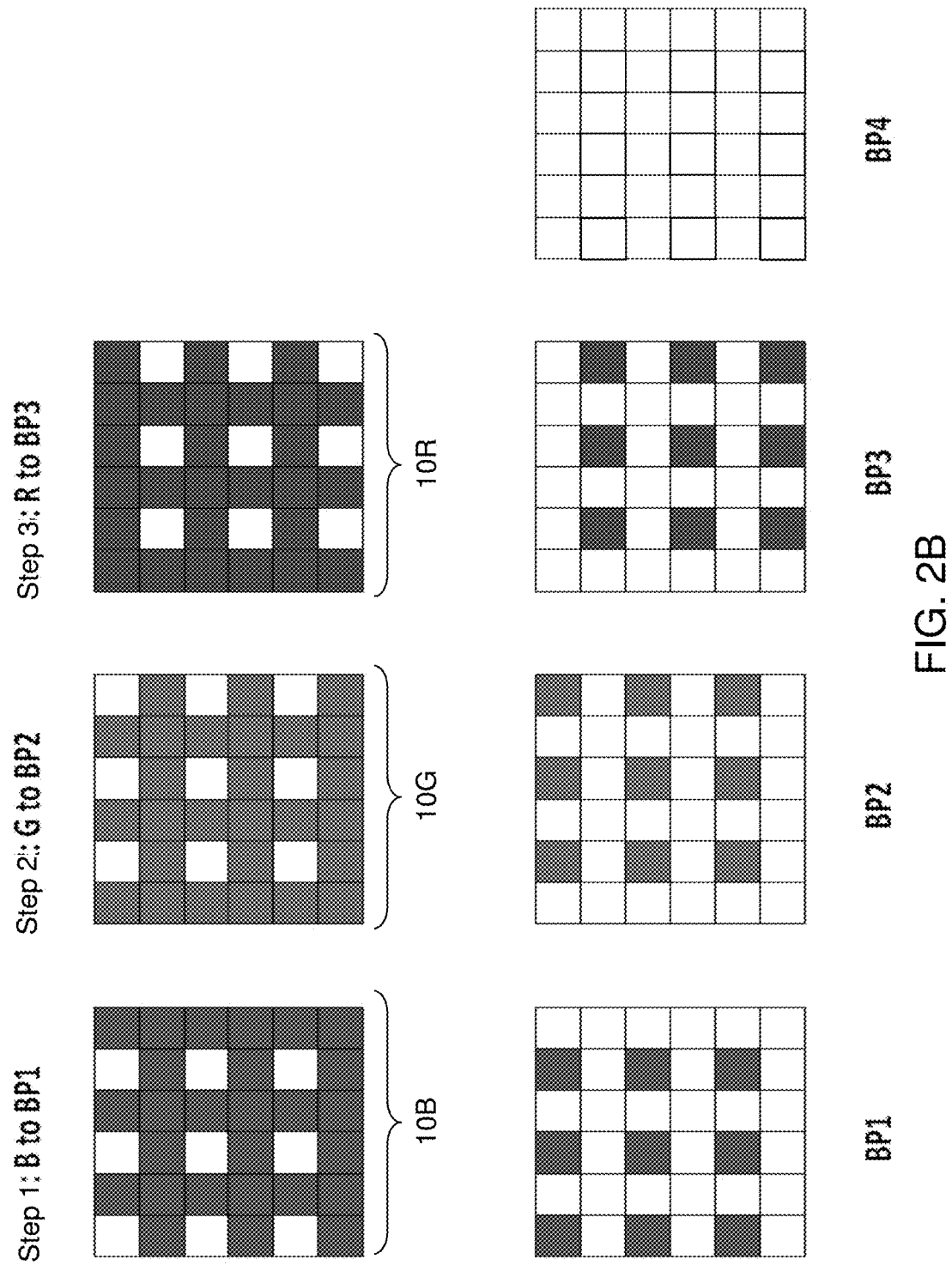
Figure 2C:
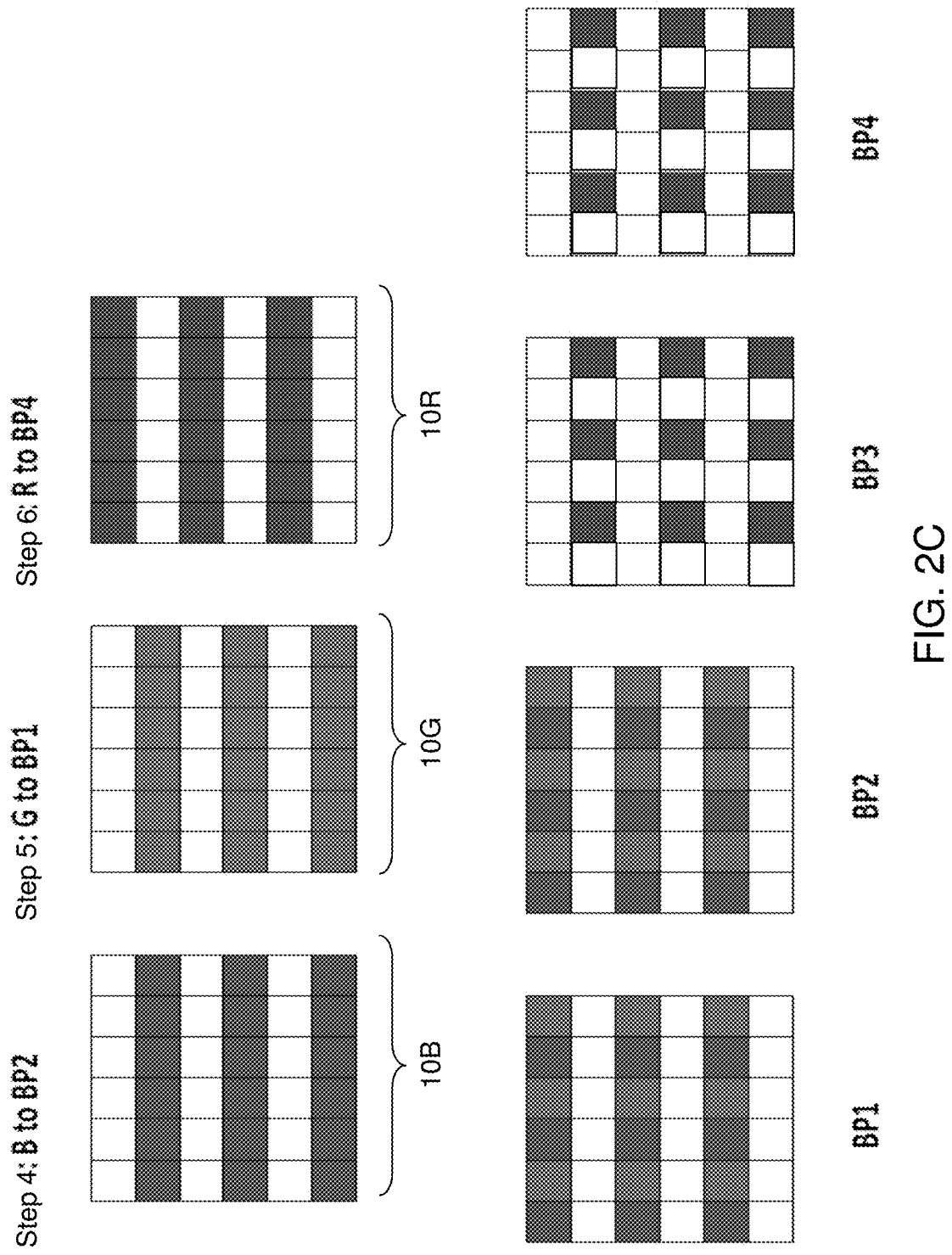
Figure 2D:
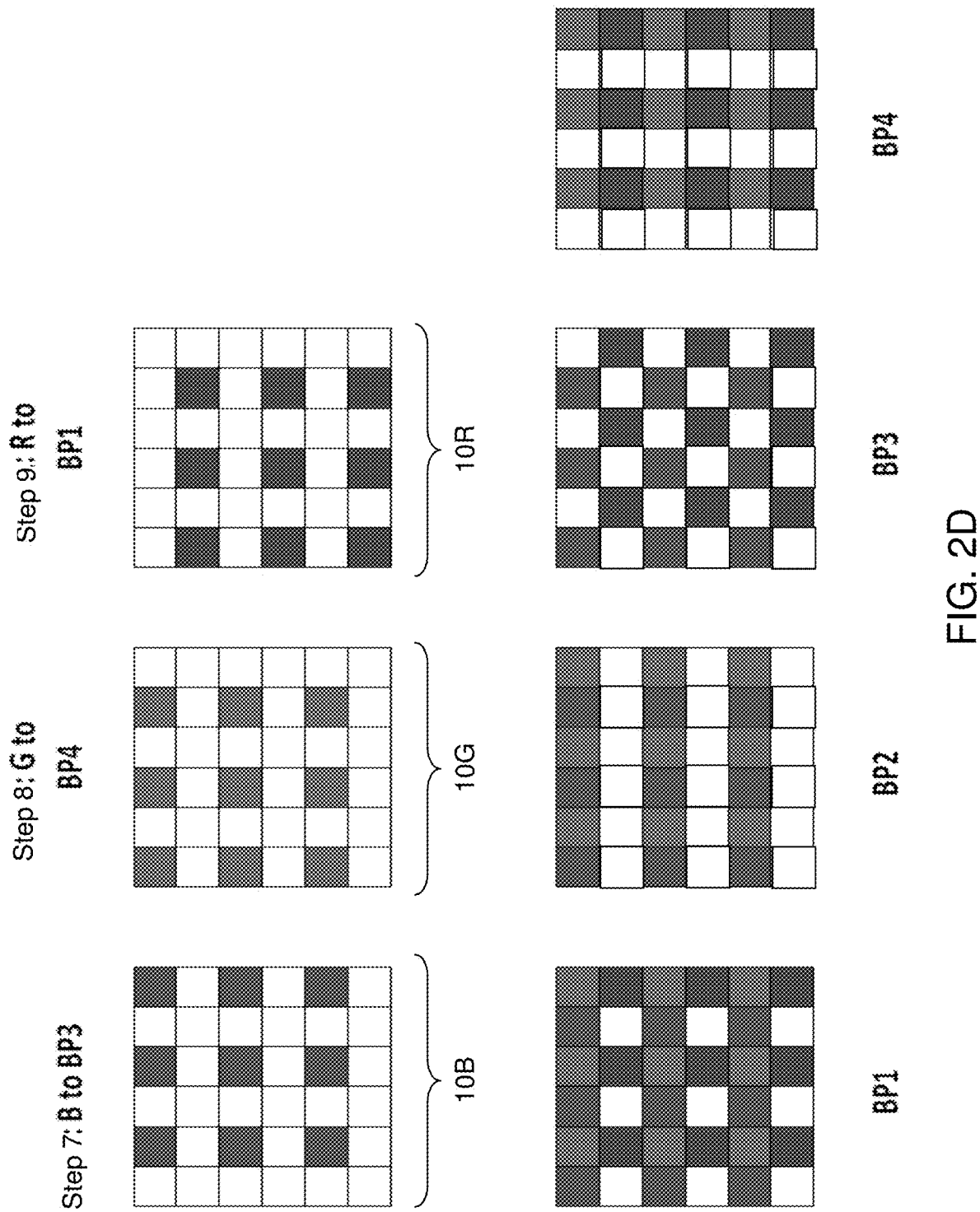

Changes in the presence or absence of the various devices (10B, 10G, 10R) on the source substrates (B, G, R) and the backplanes (BP1, BP2, BP3, BP4) at each step of the transfer sequence are illustrated in FIGS. 2A-2E. FIG. 2A corresponds to a configuration prior to any transfer of the devices (10B, 10G, 10R), FIG. 2B corresponds to the configuration after performing transfer steps 1-3, FIG. 2C corresponds to the configuration after performing steps 4-6, FIG. 2D corresponds to the configuration after performing steps 7-9, and FIG. 2E corresponds to the configuration after performing steps 10-12. It should be noted that steps 1-3 as illustrated in FIG. 2B may be shuffled in any order because steps 1-3 are independent of one another, steps 4-6 as illustrated in FIG. 2C may be shuffled in any order because steps 4-6 are independent of one another, steps 7-9 as illustrated in FIG. 2D may be shuffled in any order because steps 7-9 are independent of one another, and steps 10-12 as illustrated in FIG. 2E may be shuffled in any order because steps 10-12 are independent of one another.

While the exemplary transfer pattern and the exemplary transfer sequence is illustrated for cases in which four source substrates (B, G, R) and four backplanes (BP1, BP2, BP3, BP4) are employed, the method of the present disclosure can be applied to any case in which m transfer assemblies and n backplanes are employed, in which m is an integer greater than 1, n is an integer greater than 1, and n is not less than m. Then backplanes bond with devices from the m transfer assemblies to form n integrated light emitting device assemblies. In one embodiment, n can be the same as, or greater than, m.

A plurality of transfer assemblies, e.g., m transfer assemblies, is provided. Each of the m transfer assemblies comprises a respective source substrate (B, G, R) and respective devices (10B, 10G, 10R) within a two-dimensional array having a same two-dimensional periodicity. As used herein, a same two-dimensional periodicity for multiple structures refers to a configuration in which each of the multiple structures has a respective unit structure and instances of the respective unit structure are repeated along two independent directions of periodicity (e.g., a first periodicity direction and a second periodicity direction), and the unit structures are repeated along the respective first periodicity direction with a same first pitch and are repeated along the respective second periodicity direction with a same second pitch for all of the multiple structures, and the angle between the first periodicity direction and the second periodicity direction is the same for all of the multiple structures. Each of the n backplanes has a periodic repetition of respective unit conductive bonding structures pattern configured to mount m types of devices.

Each of the m types of devices can be one of the devices within a respective transfer assembly among the m transfer assemblies. The pitches of each unit conductive bonding structures pattern along two independent directions within each of the n backplanes can be multiples of a respective pitch of the two-dimensional periodicity of the devices within each of the m transfer assemblies. In an illustrative example, each of the devices (10B, 10G, 10R) can be periodic within a respective transfer assembly with the first periodicity of a along a first direction, and with the second periodicity of b along a second direction (which may be perpendicular to the first direction). The unit conductive bond pad pattern within each of the backplanes can have the first periodicity of 2a (which is an integer multiple of a) along a first direction, and with the second periodicity of 2b (which is an integer multiple of b) along a second direction (which may be perpendicular to the first direction).

Subsets of devices (10B, 10G, 10R) from each of the m transfer assemblies can be sequentially transferred to a respective backplane (BP1, BP2, BP3, BP4) among the n backplanes by disposing each respective transfer assembly over the respective backplane (BP1, BP2, BP3, BP4) at locations that preclude collision of existing devices on the respective transfer assembly with any devices (10B, 10G, 10R), if any, that are previously bonded to the respective backplane (BP1, BP2, BP3, BP4).

In one embodiment, a unit cell U1 of the second array configuration of the light emitting device assembly can be defined by a rectangle having a first pair of sides having a first length of the second primary-direction pitch Px2 along a respective primary direction and having a second pair of sides having a second length of the second secondary-direction pitch Py2 along a respective secondary direction. In one embodiment, the unit cell U1 can include a first-type light emitting device 10R (which may be a red light emitting device), a second-type light emitting device 10G (which may be a green light emitting device), a third-type light emitting device 10B (which may be a blue light emitting device), and a respective empty site 10E configured to accommodate a respective repair light emitting device.

If each of the first, second, and third-type light emitting devices (10R, 10G, 10B) of a pixel is functional, such a pixel is a functional pixel, and attachment of any repair light emitting device to the pixel is not necessary. If any of the first, second, and third-type light emitting devices (10R, 10G, 10B) of a pixel is defective, i.e., non-functional, such a pixel is a defective, i.e., non-functional, pixel, and attachment of a repair light emitting device to the pixel is not necessary. In this case, the empty site 10E of such a defective pixel is employed to attach a repair light emitting device. Each employ site 10E of the defective pixels is a repair site to which a repair light emitting device needs to be attached.

In general, the light emitting device assembly includes a backplane and instances of light emitting devices of the first type at bonding sites in the second array configuration. Repair sites can be identified for any given light emitting device assembly, which may be formed employing the light emitting devices from the substrate including the base pitch region 100, and/or employing light emitting devices from additional substrates. In one embodiment, a first set of repair sites can be defined based on the functionality of one type of light emitting devices, e.g., light emitting devices of the first type. Each of the first set of repair sites can be an empty site 10E configured to accommodate a respective repair light emitting device. Each of the first set of repair sites can be located within a pixel including a defective instance of the light emitting device of the first type.

Figure 3A:
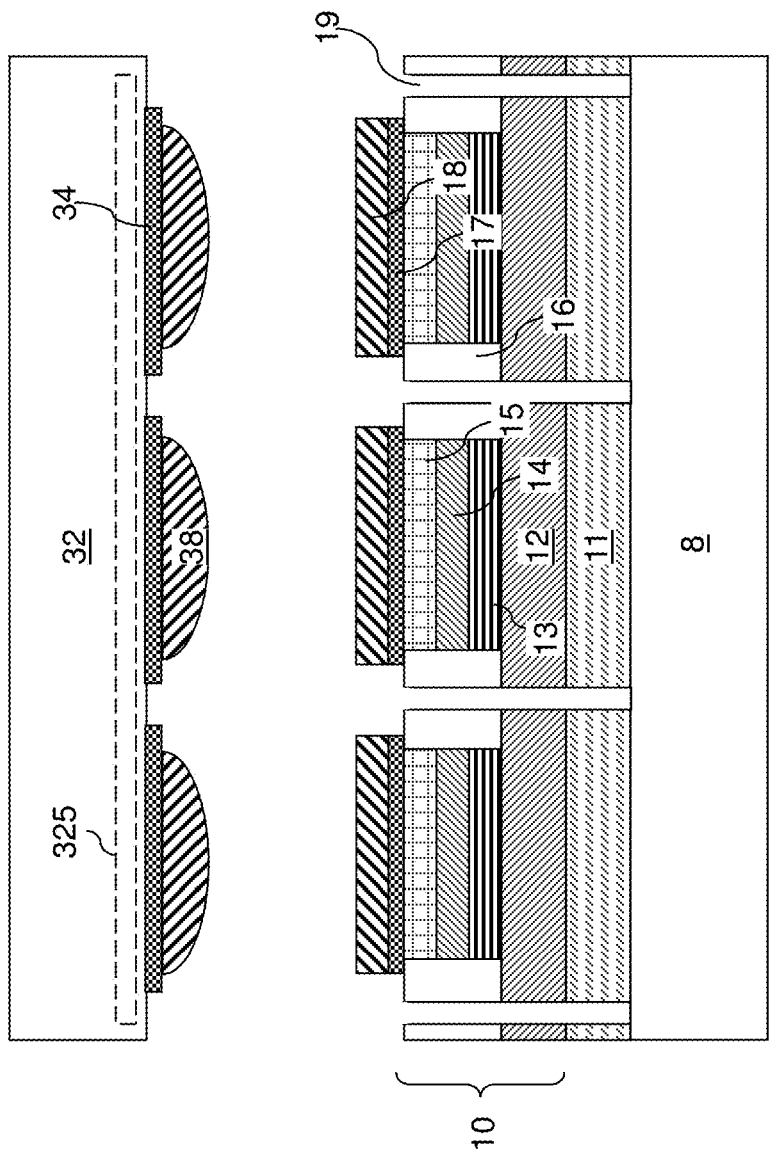
FIGS. 3A-3D are sequential vertical cross-sectional views illustrating a process for formation of an exemplary light emitting device assembly according to an embodiment of the present disclosure.

FIGS. 3A-3D illustrate a method of forming a light emitting device assembly according to an aspect of the present disclosure. Referring to FIG. 3A, a transparent material layer 8 with light emitting devices 10 thereupon is illustrated. The transparent material layer 8 may be any of the first source substrate B, the second source substrate G, and the third source substrate R described in FIGS. 2A-2D. The light emitting devices 10 can be any of the light emitting devices (10R, 10G, 10B) described above.

In one embodiment, the transparent material layer 8 can include a transparent material such as sapphire. A layer stack including an undoped III-V compound material layer, an n-doped III-V compound material layer, a multi-quantum-well layer, a p-doped compound semiconductor layer, and a transparent conductive oxide layer can be sequentially formed on the transparent material layer 8 during manufacture of light emitting devices 10. In one embodiment, the n-doped III-V compound material layer, the multi-quantum-well layer, and the p-doped compound semiconductor layer can be single crystalline, and can be epitaxially aligned to a single crystalline lattice structure of the transparent material layer 8, which may be a single crystalline sapphire (aluminum oxide) substrate.

Insulating material portions 16 including a dielectric material (such as aluminum oxide) can be formed to delineate the lateral extent of each light emitting device 10. Dicing channels 19 can be formed through the layer stack to divide the layer stack into stacks of an undoped III-V compound material layer 11 and a light emitting device 10. Each light emitting device 10 can include a vertical stack of an n-doped III-V compound material layer 12, a multi-quantum-well 13, a p-doped III-V compound semiconductor layer 14, and a transparent conductive oxide layer. 15. In a non-limiting illustrative example, each undoped III-V compound material layer 11 can include undoped gallium nitride, each n-doped III-V compound material layer 12 can include n-doped gallium nitride, each multi-quantum-well 13 can include a periodic repetition of gallium nitride layers and indium gallium nitride layers, each p-doped III-V compound semiconductor layer 14 can include p-doped gallium nitride, and/or each transparent conductive oxide layer 15 can include indium tin oxide. A stack of the transparent material layer 8 and various portions of the undoped III-V compound material layer 11 collectively constitute a substrate (8, 11), on which an array of light emitting devices 10 are provided.

A device-side bonding pad 17 can be formed on each light emitting device 10. Each device-side bonding pad 17 can include bonding pad material such as Ni, Au, and/or Cu. Optionally, a device-side solder material portion 18 can be formed on each device-side bonding pad 17. The device-side solder material portions 18 can include, for example, a lead free solder material. Thus, a substrate (8, 11) is provided with dies of light emitting devices 10 thereupon. A device-side bonding pad 17 is provided on each of the light emitting devices 10.

A backplane 32 is provided. The backplane 32 includes a transparent substrate and a metal interconnect layer 325 formed on a front side surface of the transparent substrate.

In one embodiment, the transparent substrate can include a polymeric plastic material that is transparent at the wavelength of a laser beam to be employed in a subsequent processing step. In one embodiment, the transparent substrate of the backplane 32 can be transparent within a portion of the ultraviolet range, which is a range from 10 nm to 400 nm. In one embodiment, the metal interconnect layer 325 can include a plurality of metal interconnect structures embedded in at least one insulating material and providing electrical connections between the light emitting devices to be bonded onto the backplane 32 and input/output pins of the backplane 32.

Backplane-side bonding pads 34 can be formed on the front side of the backplane 32. Optionally, a backplane-side solder material portion 38 can be formed on each backplane-side bonding pad 34.

The device-side bonding pads 17 and the backplane-side bonding pads 34 can be in an array configuration having the same pitches along two directions. For example, the device-side bonding pads 17 and the backplane-side bonding pads 34 can have the first array configuration having a primary-direction pitch Px1 and a secondary-direction pitch Py1 as illustrated in FIG. 1.

Figure 3B:
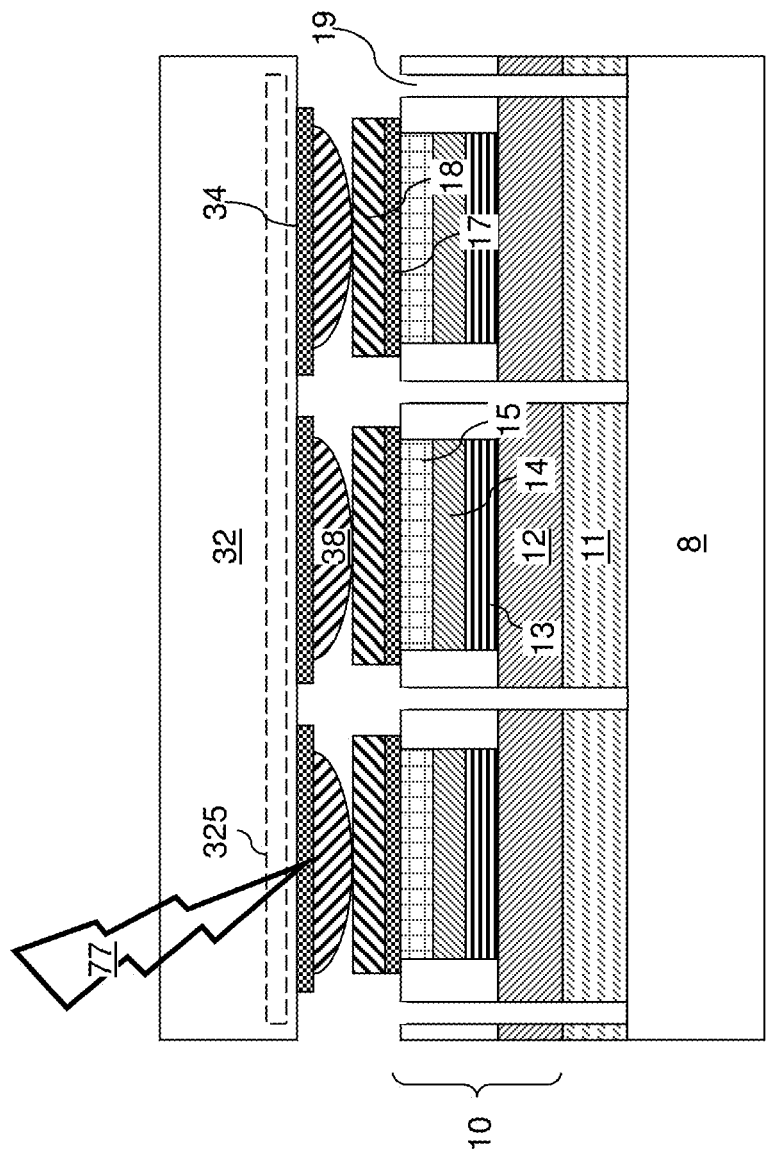

Referring to FIG. 3B, the substrate (8, 11) and the backplane 32 can be positioned such that the device-side bonding pads 17 and the backplane-side bonding pads 34 face each other. In one embodiment, the device-side bonding pads 17 may overlie, or underlie, the backplane-side bonding pads 34. At least one solder material portion (18, 38) is disposed between each facing pair of a device-side bonding pad 17 and a backplane-side bonding pad 34. In one embodiment, a pair of a device-side solder material portion 18 and a backplane-side solder material portion 38 may be disposed between each facing pair of a device-side bonding pad 17 and a backplane-side bonding pad 34.

While the backplane 32 and the substrate (8, 11) includes bonding sites in a configuration illustrated in FIG. 2A, the backplane 32 may include previously attached light emitting devices and the light emitting devices 10 that are present on the substrate (8, 11) may have empty sites corresponding to the presence of previously attached light emitting devices on the backplane 32. In other words, while transfer of the light emitting devices may occur at any processing step between the processing steps of FIGS. 2A-2E provided that matching empty sites are provided among the light emitting devices 10 on the substrate (8, 11) to avoid collision with any preexisting light emitting devices on the backplane 32.

At least one of the light emitting devices 10 is bonded to the backplane 32. A heating laser can be employed to bond a selected subset of the light emitting devices 10 to the backplane 32. Specifically, bonding of the selected subset of the light emitting devices 10 to the backplane 32 can be performed by irradiating a first laser beam 77 through the backplane 32 and reflowing respective at least one solder material portion (18, 38). In one embodiment. The metal interconnect layer 325 can have an opening within a center region of the area overlying each backplane-side bonding pad 34 to allow passage of the first laser beam 77 there through without heating any metal interconnect structures (such as metal lines and metal via structures). In other words, each center region of an area overlying a backplane-side bonding pad 34 in the metal interconnect layer 325 can be free of metal interconnect structures.

In one embodiment, the heating laser may employ infrared wavelength. For example, the heating laser can have a wavelength in a range from 0.8 micron to 20 microns, such as 1 to 2 microns, to avoid heating of the backplane 32, while heating the at least one solder material portion (18, 38). The heated and reflowed at least one solder material portion (18, 38) solidifies into a bonded solder material portion 48, which provides bonding to both the backplane 32 and to one of the light emitting devices 10.

Figure 3C:
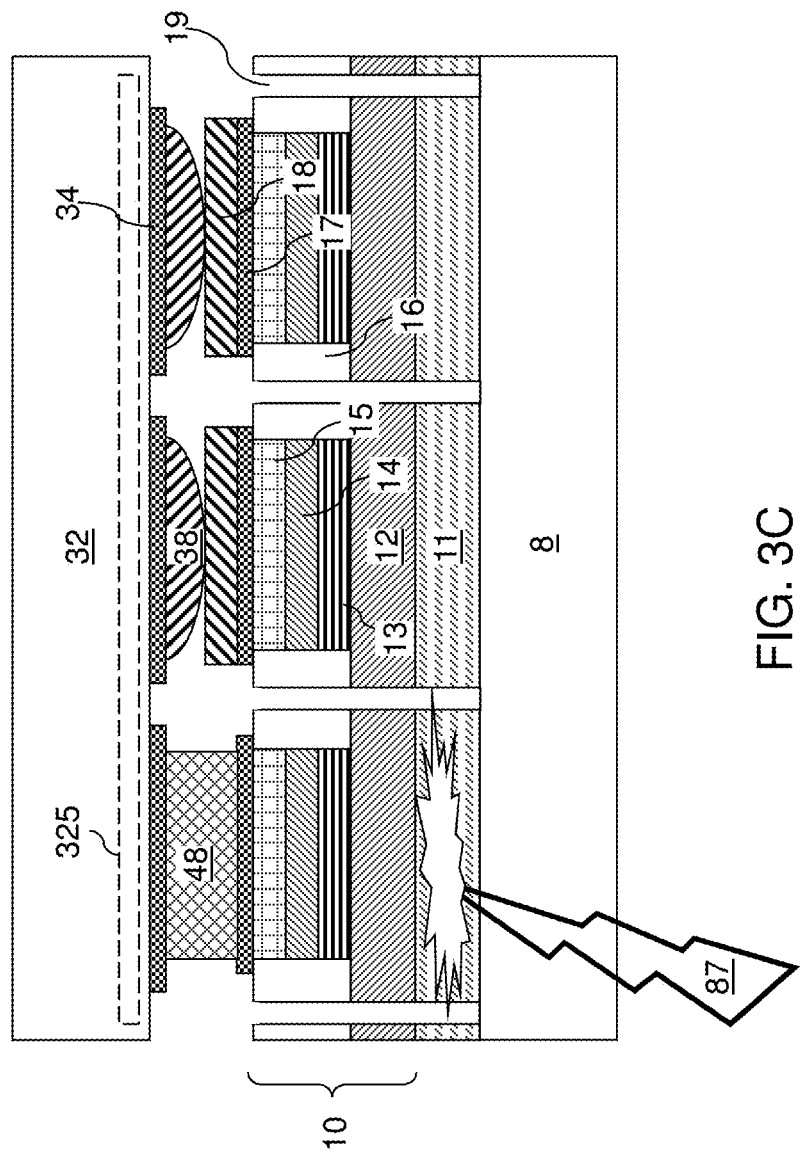

Referring to FIG. 3C, each of the at least one bonded light emitting device 10 can be dissociated from the substrate (8, 11) by irradiating a second laser beam 87 through the substrate (8, 11) and onto each region of the substrate (8, 11) in contact with the at least one bonded light emitting device 10. In one embodiment, the substrate (8, 11) comprises sapphire (as embodied within the transparent material layer 8), and each region of the substrate (8, 11) in contact with the at least one bonded light emitting device 10 prior to application the second laser beam comprises a compound semiconductor material (such as an undoped III-V compound semiconductor material).

In one embodiment, the second laser beam 87 ablates each region of the substrate (8, 11) in contact with the at least one bonded light emitting device 10. In one embodiment, the second laser beam 87 ablates each undoped III-V compound material layer 11 in contact with the at least one bonded light emitting device 10.

The wavelength of the laser (which is herein referred to an "ablation laser") employed to provide the second laser beam 87 can be different (e.g., shorter) from the wavelength of the heating laser. The wavelength of the ablation laser can be, for example between 0.1 and 0.75 micron, such as 0.25 to 0.5 micron. In one embodiment, the wavelength of the ablation laser can be within an ultraviolet range, i.e., within a range from 10 nm to 400 nm.

Figure 3D:
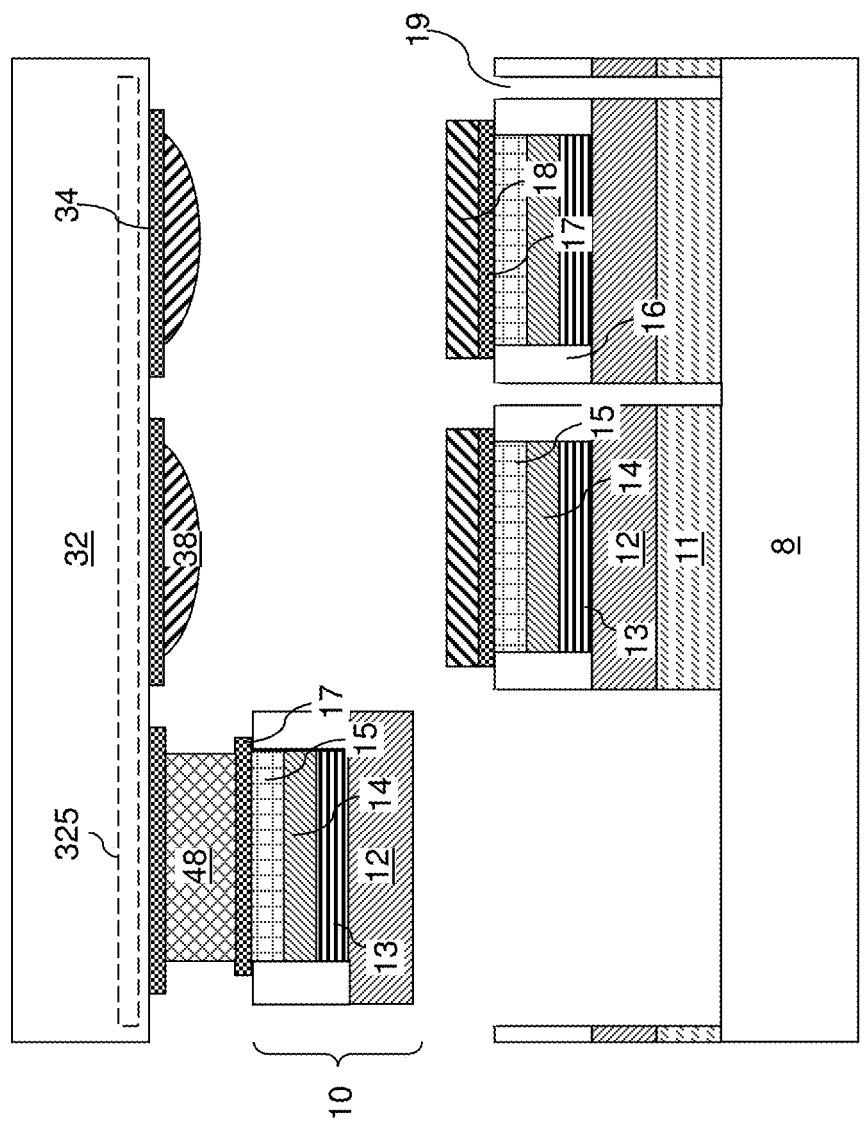

Referring to FIG. 3D, the assembly of the backplane 32 and attached light emitting devices 10 can be separated from the substrate (8, 11) and unbounded light emitting devices 10 that are attached to the substrate (8, 11). The separation of the assembly of the backplane 32 and the attached light emitting devices 10 can be performed by pulling the assembly of the backplane 32 and the attached light emitting devices 10 away from the substrate (8, 11) because each portion of the undoped III-V compound material layer 11 that held an overlying light emitting device was ablated at the processing step of FIG. 3C.

FIGS. 4A-4C illustrate a method of forming a light emitting device assembly according to an aspect of the present disclosure. At least one light emitting device, which may include at least one defective light emitting device, can be removed from an exemplary light emitting device assembly to provide at least one empty site to which at least one replacement light emitting device can be attached. The backplane 32 and/or the light emitting devices 10 can be the same as in previously described embodiments.

Light emitting devices 10 can be transferred from a substrate (8, 11) to a backplane 32 by bonding the light emitting devices 10 to bonding sites on the backplane 32 employing the methods described above. Different types of light emitting devices 10 can be attached to the backplane 32 to form a pixel, in which each light emitting device 10 therein functions as a subpixel. For example, the method described in FIGS. 2A-2E can be employed to form a light emitting device assembly including the backplane 32 and the array of light emitting devices 10.

Referring to FIG. 4B, at least one defective light emitting device 10 can be identified, for example, by testing the light emitting devices as bonded to the backplane 32. Each of the at least one defective light emitting device 10 can be subsequently removed from the backplane 32 for replacement with at least one functional light emitting devices. For example, a vacuum suction can be provided to each selected light emitting device 10. In one embodiment, a vacuum chuck 88 can be applied to the transferred light emitting devices 10 at this processing step. In one embodiment, the vacuum chuck 88 can apply vacuum suction to all of the light emitting devices 10 attached to the backplane 32.

A laser irradiation process is performed, in which a laser beam 97 can pass through the backplane 32 and irradiate each bonded solder material portion 48 underlying the at least one defective light emitting device 10. As the irradiated bonded solder material portion 48 reflows, an overlying light emitting device 10 can be dissociated from the backplane 32. The vacuum suction can be maintained throughout the laser irradiation process. Thus, each light emitting device 10 overlying the irradiated bonded solder material portion 48 can be dissociated from the backplane 32.

Referring to FIG. 4C, each defective light emitting device 10 that is dissociated from the backplane through the laser irradiation process can be removed by pulling away the vacuum chuck 88 from the remaining light emitting device assembly while maintaining vacuum suction on the dissociated light emitting devices 10. Thus, the vacuum suction to each dissociated light emitting device 10 is maintained while separating the vacuum chuck 88 from a subset of the light emitting devices 10 that remain on the backplane after the laser irradiation process. A backplane-side solder material portion 98 can be provided on each backplane-side bonding pad 34 from which a light emitting device 10 is detached.

In one embodiment, the backplane 32 can comprise a polymeric plastic material that is transparent at the ultraviolet wavelength of the laser beam 97. In one embodiment, the laser beam 97 can have an ultraviolet wavelength, i.e., a wavelength in a range from 10 nm to 400 nm. In one embodiment, the backplane 32 comprises a metal interconnect layer 325 including a plurality of metal interconnect structures embedded in at least one insulating material and providing electrical connections between the light emitting devices 10 on the backplane 32 and input/output pins of the backplane 32.

FIGS. 5A and 5B illustrate a method of forming a light emitting device assembly according to an aspect of the present disclosure. Referring to FIG. 5A, the backplane 32 and/or the light emitting devices 10 can include the same components as in previously described embodiments. For example, the light emitting device assembly can be formed transferring light emitting devices 10 from a substrate (8, 11) to a backplane by bonding light emitting devices 10 to bonding sites on the backplane 32. In addition, the backplane 32 can include at least one device component 62A thereupon, which may be at least one discrete device component. As used herein, a discrete device component refers to a single device component that is not electrically connected to other device components. Examples of device components include, but are not limited to, laser fuses, conductive traces, and routing circuits for powering the light emitting devices 10.

At least one device component 62A in an exemplary light emitting device assembly can be modified employing a laser beam 97. Specifically, an electrical characteristic of a selected device component on the backplane 32 can be modified by irradiating the laser beam 97 through the backplane 32. In this case, the laser beam 97 passes through the backplane 32 and onto the device component 62A such that the laser beam 97 induces a physical change in the device component 62A. In an illustrative example, the electrical characteristic of the selected device component can be resistance or conductivity of the device component, and the physical change may be ablation of a portion of an electrically conductive path of the selected device component. Thus, a conductive path provided within a device component 62A may provide an electrical open after irradiation by the laser beam 97. A device component 62A that is irradiated by the laser beam 97 to change electrical characteristics becomes a programmed device component 62B. In contrast, device components 62A that are not irradiated by the laser beam 97 to maintain the initial electrical characteristics are herein referred to unprogrammed device components. FIG. 5B illustrates a configuration in which a programmed device component 62B and unprogrammed device components 62A are present on the backplane 32.

In one embodiment, each of the light emitting devices 10 can comprise a vertical stack of a multi-quantum-well 13, a p-doped III-V compound semiconductor layer 14, and a transparent conductive oxide layer 15. In one embodiment, the laser beam 97 can have an ultraviolet wavelength (i.e., a wavelength in a range from 10 nm to 400 nm), and the backplane 32 can comprise a polymeric plastic material that is transparent at the ultraviolet wavelength of the laser beam 97. In one embodiment, the backplane 32 can comprise a metal interconnect layer 325 including a plurality of metal interconnect structures embedded in at least one insulating material and providing electrical connections between the light emitting devices 10 on the backplane 32 and input/output pins of the backplane 32.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. Where an embodiment employing a particular structure and/or configuration is illustrated in the present disclosure, it is understood that the present invention may be practiced with any other compatible structures and/or configurations that are functionally equivalent provided that such substitutions are not explicitly forbidden or otherwise known to be impossible to one of ordinary skill in the art.

What is claimed is:
1. A method of manufacturing an assembly of a backplane and a light emitting device, the method comprising:
   providing the backplane containing first and second backplane-side bonding pads;
   providing a substrate containing first and second light emitting devices thereupon, wherein a first device-side bonding pad is provided on the first light emitting device, and a second device-side bonding pad is provided on the second light emitting device;
   bonding the first light emitting device to the backplane by irradiating a heating laser beam on a first solder material portion located between the first device-side bonding pad and the first backplane-side bonding pad; and
   dissociating from the substrate the first light emitting device that is bonded to the backplane by irradiating an ablation laser beam through the substrate and onto each region of the substrate in contact with the first light emitting device;
   wherein:
   the first and second light emitting devices comprise vertical light emitting diodes in which the p-side and n-side contacts are located on opposite sides of the light emitting diode;

the substrate comprises a stack of a transparent material layer and an undoped III-V compound material layer; and the ablation laser beam passes through the transparent material layer and ablates an irradiated portion of the undoped III-V compound material layer.

2. The method of claim 1, wherein:

the ablation laser beam has a shorter wavelength than the heating laser beam; and the first and second light emitting devices comprise vertical light emitting diodes in which the p-side and n-side contacts are located on opposite sides of the light emitting diode.

3. The method of claim 2, wherein the ablation laser beam comprises an ultraviolet laser beam and the heating laser beam comprises an infrared laser beam.

4. The method of claim 1, wherein a second solder material portion located between the second device-side bonding pad and the second backplane-side bonding pad is not irradiated by the heating laser beam such that the second light emitting device is not bonded to the backplane.

5. The method of claim 4, further comprising separating the assembly of the backplane and the first light emitting device from the second light emitting device attached to the substrate.

6. The method of claim 5, wherein the transparent material layer comprises sapphire.

\* \* \* \* \*